United States Patent
Kwok et al.

(10) Patent No.: US 8,612,834 B2
(45) Date of Patent: Dec. 17, 2013

(54) APPARATUS, SYSTEM, AND METHOD FOR DECODING LINEAR BLOCK CODES IN A MEMORY CONTROLLER

(75) Inventors: Zion S. Kwok, Vancouver (CA); Scott Nelson, Vancouver (CA)

(73) Assignee: Intel Corporation, Santa Clara, CA (US)

( * ) Notice: Subject to any disclaimer, the term of this patent is extended or adjusted under 35 U.S.C. 154(b) by 352 days.

(21) Appl. No.: 13/043,085

(22) Filed: Mar. 8, 2011

(65) Prior Publication Data
US 2012/0233521 A1  Sep. 13, 2012

(51) Int. Cl.
*H03M 13/00* (2006.01)
(52) U.S. Cl.
USPC ........... 714/781; 714/782; 714/783; 714/784; 714/785
(58) Field of Classification Search
USPC .................................................. 714/781–785
See application file for complete search history.

(56) References Cited

U.S. PATENT DOCUMENTS

| | | | | |
|---|---|---|---|---|
| 3,568,153 A * | 3/1971 | Kurtz et al. | 714/764 |
| 3,573,728 A * | 4/1971 | Kolankowsky et al. | 714/764 |
| 4,277,844 A * | 7/1981 | Hancock et al. | 714/755 |
| 4,319,356 A * | 3/1982 | Kocol et al. | 714/754 |
| 4,523,314 A * | 6/1985 | Burns et al. | 714/765 |
| 4,531,213 A * | 7/1985 | Scheuneman | 714/703 |
| 4,561,095 A * | 12/1985 | Khan | 714/767 |
| 4,617,664 A * | 10/1986 | Aichelmann et al. | 714/758 |
| 4,670,876 A * | 6/1987 | Kirk | 714/703 |
| 4,716,566 A * | 12/1987 | Masuhara et al. | 714/758 |
| 4,794,597 A * | 12/1988 | Ooba et al. | 714/703 |
| 4,817,095 A * | 3/1989 | Smelser et al. | 714/764 |
| 4,993,028 A * | 2/1991 | Hillis | 714/762 |
| 5,142,541 A * | 8/1992 | Kim et al. | 714/764 |
| 5,452,429 A * | 9/1995 | Fuoco et al. | 714/6.1 |
| 5,488,691 A * | 1/1996 | Fuoco et al. | 714/52 |
| 5,537,425 A * | 7/1996 | Tsou | 714/805 |
| 5,633,882 A * | 5/1997 | Babb et al. | 714/785 |
| 5,666,371 A * | 9/1997 | Purdham | 714/763 |
| 6,041,368 A * | 3/2000 | Nakatsuji et al. | 710/20 |
| 6,041,430 A * | 3/2000 | Yamauchi | 714/752 |
| 6,460,157 B1 * | 10/2002 | Chen et al. | 714/758 |
| 6,539,516 B2 * | 3/2003 | Cameron | 714/785 |
| 6,662,333 B1 * | 12/2003 | Zhang et al. | 714/767 |
| 6,701,480 B1 * | 3/2004 | Karpuszka et al. | 714/764 |
| 7,096,409 B2 * | 8/2006 | Banks | 714/784 |
| 7,152,138 B2 * | 12/2006 | Spencer et al. | 711/103 |
| 7,171,591 B2 * | 1/2007 | Chen | 714/52 |

(Continued)

OTHER PUBLICATIONS

Stephen B. Wicker, Error Control for Digital Communication and Storage, Prentice-Hall 1995; pp. 99-121.*

*Primary Examiner* — Joseph D Torres
(74) *Attorney, Agent, or Firm* — Blakely, Sokoloff, Taylor & Zafman LLP

(57) ABSTRACT

Described herein are an apparatus, system, and method for encoder assisted decoding of linear systematic block codes. The apparatus comprises a first logic unit to receive a codeword from a memory, the codeword having a data portion and a corresponding parity portion; an encoder to encode the data portion of the received codeword and to generate a corresponding parity of the data portion of the received codeword; a second logic unit to generate a first parity portion from the corresponding parity portion of the codeword received by the first logic unit and the corresponding parity portion generated by the encoder; and a correction unit to correct the data portion of the codeword via the generated first parity portion.

24 Claims, 7 Drawing Sheets

(56) References Cited

U.S. PATENT DOCUMENTS

| | | | |
|---|---|---|---|
| 7,243,293 B2 * | 7/2007 | Chen | 714/781 |
| 7,275,200 B2 * | 9/2007 | Leung | 714/763 |
| 7,278,085 B1 * | 10/2007 | Weng et al. | 714/766 |
| 7,328,365 B2 * | 2/2008 | Karpuszka et al. | 714/6.2 |
| 7,434,136 B2 * | 10/2008 | Ichihara et al. | 714/755 |
| 7,529,986 B2 * | 5/2009 | Riho et al. | 714/710 |
| 7,562,283 B2 * | 7/2009 | Falik et al. | 714/785 |
| 7,954,034 B1 * | 5/2011 | Curry et al. | 714/758 |
| 8,069,392 B1 * | 11/2011 | Norrie | 714/758 |
| 8,151,162 B2 * | 4/2012 | Kanaoka et al. | 714/755 |
| 8,169,825 B1 * | 5/2012 | Shalvi et al. | 365/185.09 |
| 2005/0286330 A1 * | 12/2005 | Ito et al. | 365/222 |

* cited by examiner

APPARATUS, SYSTEM, AND METHOD FOR DECODING LINEAR BLOCK CODES IN A MEMORY CONTROLLER

FIELD OF THE INVENTION

Embodiments of the invention relate generally to the field of memory controllers. More particularly, embodiments of the invention relate to an apparatus, system, and method for encoded assisted decoding of systematic linear block codes by a memory controller.

BACKGROUND

For a memory controller interfacing with a memory via one or more memory channels and having a shared error correction code (ECC) decoder, data received from the memory to the memory controller is queued up prior to being decoded by the decoder and then corrected for any errors in the received data. The queue in such traditional memory controllers has to be large enough to store data from the one or more memory channels reading data from the memory. The decoder coupled to the queue that receives the data, via the queue from the memory, determines the parity associated with the data and identifies any error in the data received from the memory. The data is then transmitted from the memory controller to the processor for processing after the error in the data is corrected based on the parity error.

The queue and the decoder hardware of the memory controller is one of the timing bottlenecks limiting fast error correction of data received from memory. The queue and the decoder hardware also take up a large silicon area to handle the large amount of data i.e., to decode and identify errors in the data from the memory.

BRIEF DESCRIPTION OF THE DRAWINGS

Embodiments of the invention will be understood more fully from the detailed description given below and from the accompanying drawings of various embodiments of the invention, which, however, should not be taken to limit the invention to the specific embodiments, but are for explanation and understanding only.

DETAILED DESCRIPTION

Figure 1:
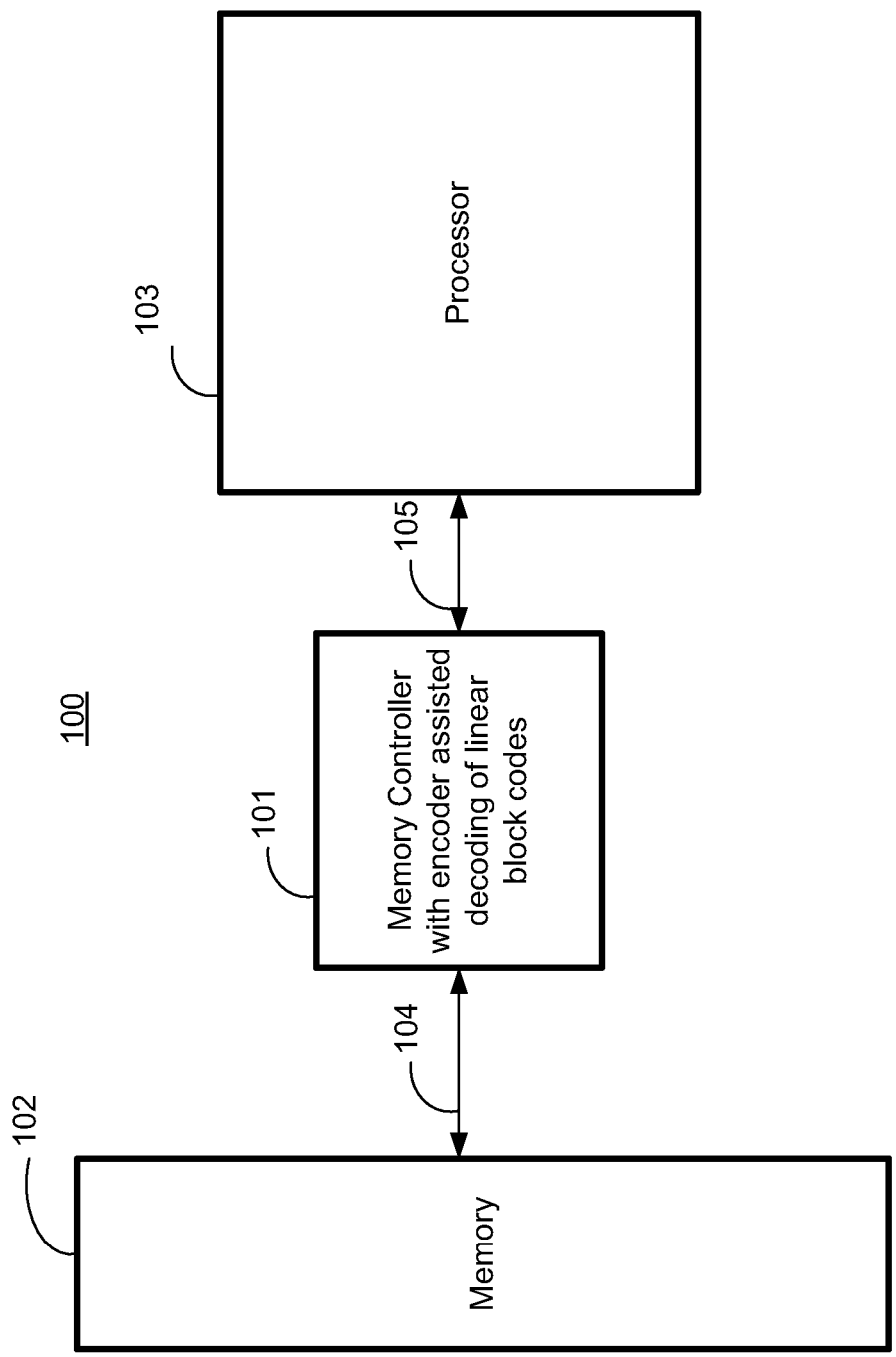
FIG. 1 is a high level system diagram having a memory controller with encoder assisted decoding of linear block codes, according to one embodiment of the invention.

Embodiments of the invention relate to an apparatus, system, and method for encoded assisted decoding of systematic linear block codes by a memory controller.

The embodiments of the invention result in a hardware queue size of a memory controller which is 10-15 times smaller than a traditional queue size for storing data received from a memory. One reason for a smaller hardware queue size is that the queue only stores exclusive-ORed parity bits generated by an encoder of the memory controller, according to one embodiment of the invention. The embodiments of the invention also result in less hardware for a decoder compared to traditional error correction code (ECC) decoders because the decoder, in one embodiment, only receives exclusive-ORed parity bits from the queue instead of the large data received from the memory via the traditional large sized queue.

In one embodiment, a smaller queue size and decoder size improve the performance of the memory controller as measured by power consumption, latency of data from the memory to the processor, re-use of encoder logic block which is traditionally idle during a memory read operation, and silicon area of the memory controller. A higher performance with reference to power consumption refers to less power consumption as compared to power consumption of a traditional memory controller with large queue and decoder sizes. A higher performance with reference to latency of the data from the memory to the processor refers to shorter latencies from the memory to the processor caused by smaller queue and decoder logic units. A higher performance with reference to re-use of the encoder logic block refers to encoding the received data from memory during a read operation which traditionally does not use the encoder logic block. A higher performance with reference to a silicon area of the memory controller refers to a fewer number of active transistors in the memory controller caused by reduced size of the queue and/or the decoder.

In the following description, numerous details are discussed to provide a more thorough explanation of embodiments of the present invention. It will be apparent, however, to one skilled in the art, that embodiments of the present invention may be practiced without these specific details. In other instances, well-known structures and devices are shown in block diagram form, rather than in detail, in order to avoid obscuring embodiments of the present invention.

Note that in the corresponding drawings of the embodiments signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme, e. g., differential pair, single-ended, etc.

FIG. 1 is a high level system diagram 100 with a memory controller 101 with encoder assisted decoding of linear block codes, according to one embodiment of the invention. In one embodiment, the memory controller 101 is coupled to a memory unit 102 and a processor 103 via transmission media 104 and 105 respectively. In one embodiment, the transmission media 104 is a Peripheral Component Interconnect (PCI) Express. In one embodiment, the transmission media 105 is based on a Serial Advanced Technology Attachment (SATA). In one embodiment, the transmission media 105 is a Serial Attached Small Computer System Interface (SCSI) bus, also referred to as SAS. In one embodiment, the memory unit 102 comprises one or more flash memories. In one embodiment, the one or more flash memories are NAND flash memories. In another embodiment, the one or more flash memories are NOR flash memories. In one embodiment, the memory controller is a Solid State Drive (SSD) memory controller. While FIG. 1 shows the memory controller 101 as an independent logic block outside of the processor 103, in one embodiment the memory controller 101 is integrated within the processor 103 without changing the essence of the embodiments of the invention.

Figure 2A:
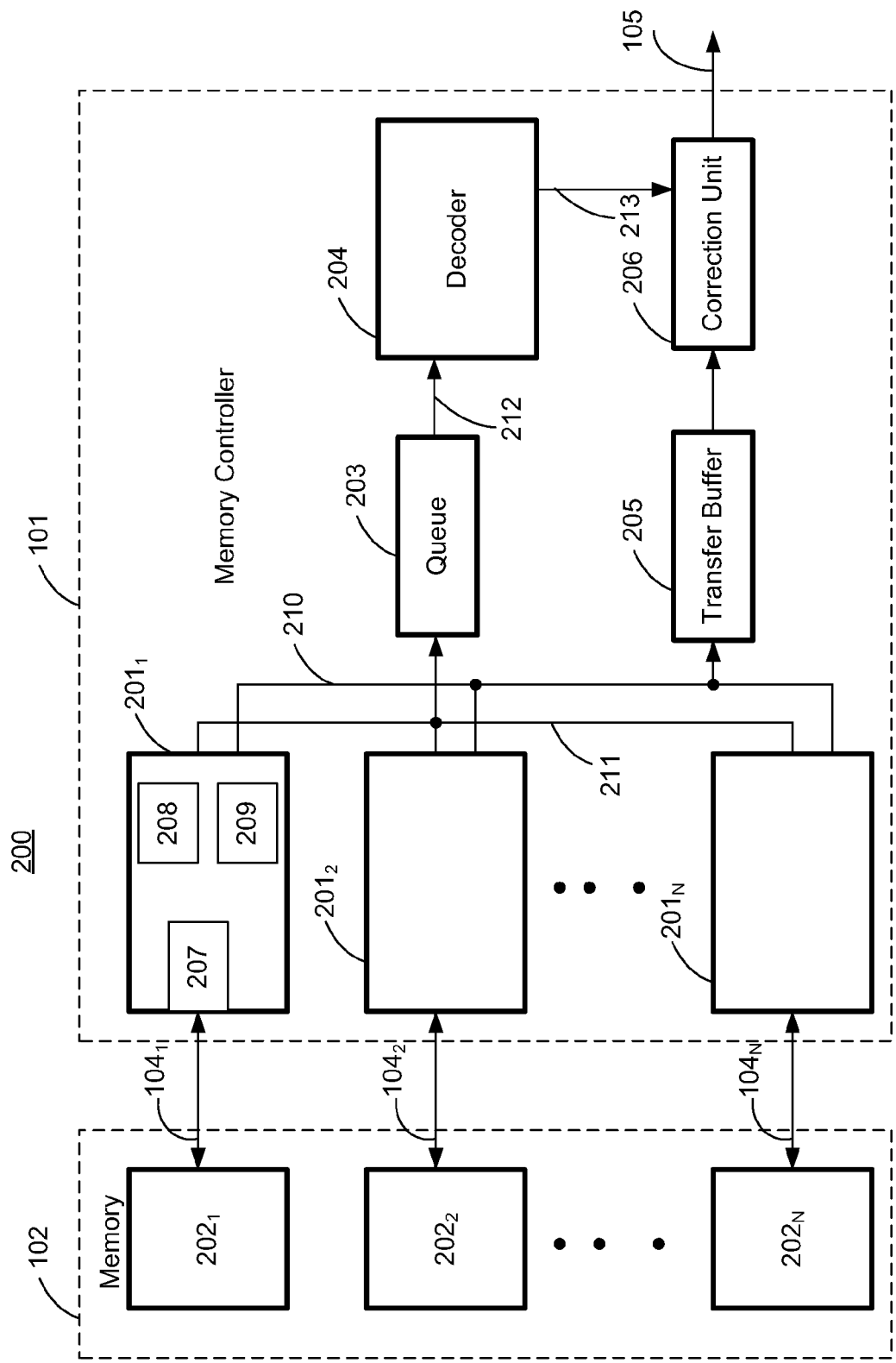
FIG. 2A illustrates block level details of the memory controller with encoder assisted decoding of linear block codes, according to one embodiment of the invention.

FIG. 2A illustrates block level details of a system 200 having the memory 102 coupled to the memory controller 101 with encoder assisted decoding of linear block codes, according to one embodiment of the invention. In one embodiment, the memory unit 102 comprises one or more memory units $202_1$-$202_N$ coupled to corresponding memory controller input-output (I/O) channel interface logic units $201_1$-$201_N$ via transmission media $104_1$-$104_N$ respectively. So as not to obscure the embodiments of the invention, logic components of the I/O channel interface logic unit $201_1$ is discussed from among the I/O channel interface logic units $201_1$-$201_N$.

In one embodiment, the I/O channel interface logic unit $201_1$ comprises a first logic unit 207 operable to receive a codeword from the corresponding memory unit $202_1$. The codeword in memory comprises a data portion and a corresponding parity portion. In one embodiment, the I/O channel interface logic unit $201_1$ further comprises an encoder 208, coupled to the first logic unit 207, to encode the data portion of the received codeword and to generate a corresponding parity of the data portion of the received codeword. In one embodiment, the encoder 208 is configured to encode a linear block code which is systematic.

In one embodiment, the I/O channel interface logic unit $201_1$ further comprises a second logic unit 209 which is operable to generate a first parity portion 211 from the corresponding parity portion of the codeword received by the first logic unit 207 and the corresponding parity portion generated by the encoder 208. In one embodiment, the second logic unit generates the first parity portion 211 by applying a logical exclusive-OR (XOR) operation to the corresponding parity portion of the codeword received by the first logic unit 207 and the corresponding parity portion generated by the encoder 208.

In one embodiment, the memory controller 101 further comprises a hardware queue 203 which is operable to receive only the first parity portion 211 from the I/O channel interface logic units $201_1$-$201_N$. One reason for the queue 203 to only receive the first parity portion 211 is that the encoded data portion of the codeword is all zeros and so it does not need to be transmitted to a decoder 204 to determine an error location of any error in the data portion of the receive codeword. In one embodiment, the hardware queue 203 is operable to receive the first parity portion 211 from the I/O channel interface logic units $201_1$-$201_N$ and a compressed form of the data portion (from a logic unit not shown), which is zero.

The following mathematical formulations show the logical operations performed by the encoder 208, the second logic unit 209, and the decoder 204, according to one embodiment of the invention.

Let 'u' be the data which is to be stored in memory $202_1$. Let 'G' be a generator matrix defined as G=[I|P], where T is an identity matrix and 'P' is the parity matrix of the data 'u', and where 'P' is used to generate the parity for the data 'u'.

Let $c_1$ be the encoded codeword generated by the encoder 208 during a memory write operation associated with data 'u', where $c_1$ is a multiplication of the data 'u' and the generator matrix G, i.e., $c_1$=uG. The encoded codeword $c_1$ is stored in memory unit $202_1$ during a write operation.

Let $r_1$ be the encoded codeword received from the memory unit $202_1$ by the first logic unit 207, where $r_1$=$c_1$+e and where 'e' is a vector of all the bit errors associated with the received codeword $r_1$. The encoder 208 is configured to generate the encoded received codeword $c_2$ with corresponding parity bits by matrix multiplication of $r_{1u}$ and G i.e., $c_2$=$r_{1u}$G, where $r_{1u}$ is the data portion of the received codeword $r_1$. The generation of the codeword $c_2$ by the encoder 208 is performed during a memory read operation.

In the embodiments discussed herein the encoder 208 is configured for encoding data before writing that data to memory $202_1$ i.e., memory write operation, and also configured for encoding data upon receiving the previously stored encoded data in memory $202_1$ i.e., memory read operation. Such re-use of the encoder 208, which would otherwise be idle during a memory read operation, allows the embodiments of the invention to have higher performance than traditional memory controllers that do not re-use the encoder 208 logic unit during a memory read operation.

The second logic unit 209 is operable to generate $r_3$ by matrix addition of the received codeword $r_1$ and the encoded received codeword $c_2$ i.e., $r_3$=$r_1$+$c_2$. The data portion of $r_3$ is all zeros because the code is systematic. Since the data portion of $r_3$ is all zeros, the data portion of $r_3$ is compressed to a single bit '0' before sending the compressed data to the queue 203, according to one embodiment of the invention. In another embodiment, the data portion of $r_3$ is not sent to the decoder 204 via the queue 203 because the data portion $r_3$ is always zero and thus a known quantity. Since the data portion of $r_3$ is a zero, only a logical exclusive-OR (XOR) of the parity bits $r_{1p}$ of the received codeword $r_1$ with the parity bits $c_{2p}$ of the encoded codeword $c_2$ is performed to generate $r_{3p}$, according to one embodiment of the invention. In such an embodiment, the XORed parity $r_{3p}$ is then stored in the queue 203. Compared to traditional queues of a memory controller, the queue 203 only stores XORed parity bits $r_{3p}$ in its queue, according to one embodiment of the invention. In another embodiment, the queue 203 stores the XORed parity bits $r_{3p}$ and the compressed zero data bit representing that the data portion of $r_3$ is all zero.

In one embodiment, the decoder 204 is configured to determine the locations of the error 'e' so that the error 'e' is cancelled from the received codeword $r_1$. In one embodiment, the XORed parity $r_{3p}$ 212 is sufficient to decode for the error locations in the error vector 'e'. In such an embodiment, the hardware of the decoder is simplified because it does not need to handle i.e., process large data from the queue but only the XORed parity $r_{3p}$ 212. As mentioned above, in one embodiment the decoder 204 is also configured to receive compressed data information 212 which indicates that the data portion of $r_3$ received from the queue 203 is zero. In one embodiment, if $r_{3p}$ is zero, then there are no errors in the received codeword $r_1$. In one embodiment, the decoder 204 is an ECC decoder which is operable to decode the XORed $r_3$ and to determine the error locations 213 in the data portion of the received codeword $r_1$.

In one embodiment, the memory controller comprises a correction unit 206 which is configured to receive the error locations 213 from the decoder 204 and the user data 210 from a transfer buffer 205. In one embodiment, the transfer buffer 205 stores the user data portion $r_{1u}$ (210) of the received codeword $r_1$. In one embodiment, the correction unit 206 corrects the errors in the user data portion $r_{1u}$ at the locations of the errors 213 to generate corrected data. In one embodiment, the corrected data is sent to the processor 103 for processing via transmission media 105.

Figure 2B:
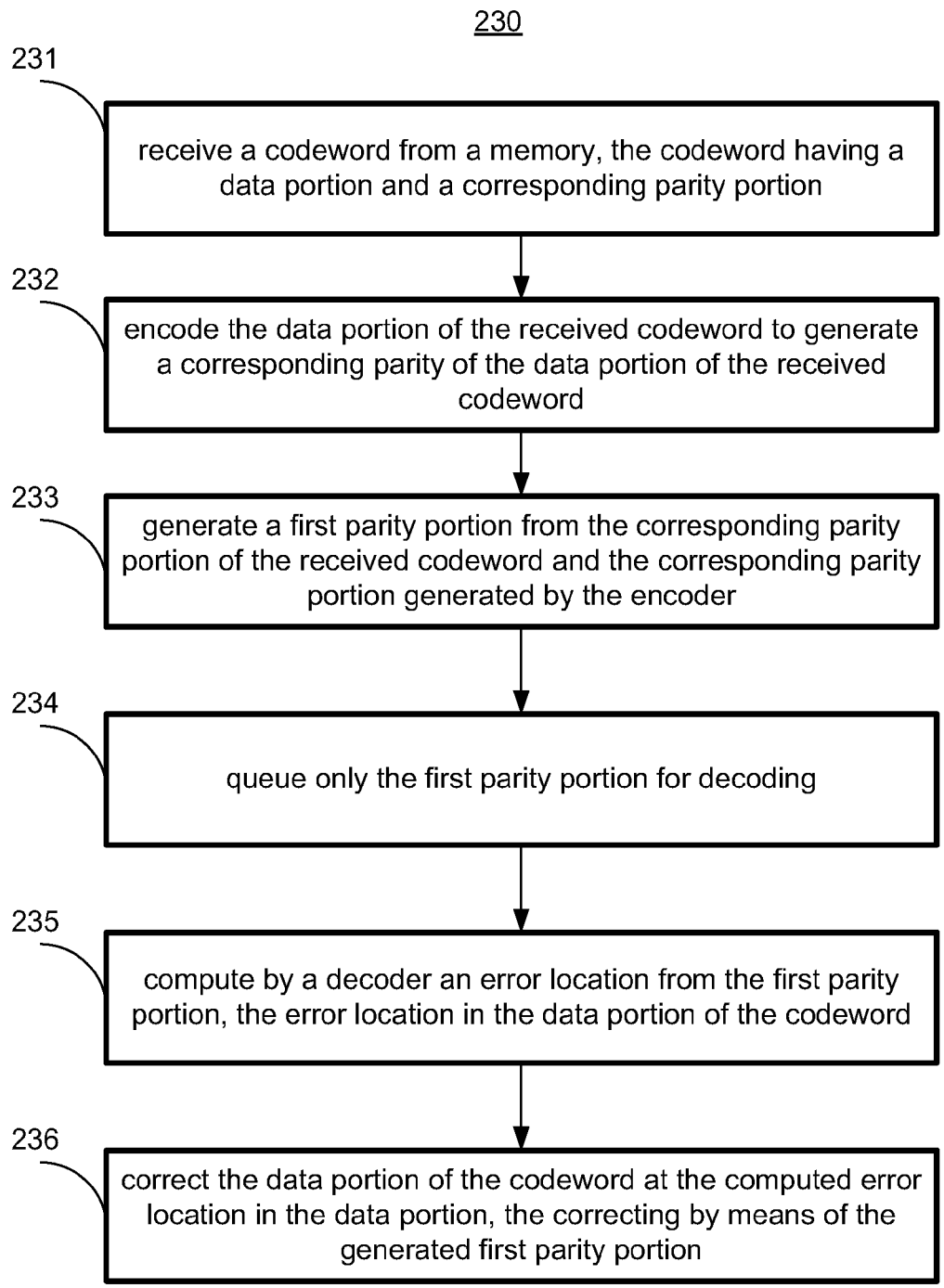
FIG. 2B illustrates a flowchart of encoder assisted decoding of linear block codes, according to one embodiment of the invention.

FIG. 2B illustrates a flowchart 230 of an encoder assisted decoding of linear block codes, according to one embodiment of the invention. FIG. 2B is described with reference to FIG. 2A.

At block 231, a codeword from the memory $202_1$ is received by the first logic unit 207, the received codeword $r_1$ having a data portion and a corresponding parity portion. At block 232, the data portion $r_{1u}$ of the received codeword $r_1$ is encoded by the encoder 208 to generate a corresponding parity $c_{2p}$ of the data portion of the received codeword $r_{1u}$. At block 233, a first parity portion $r_{3p}$ is generated by the second logic unit 209 from the corresponding parity portion $r_{1p}$ of the received codeword and the corresponding parity portion $c_{2p}$ generated by the encoder 208. At block 234, only the first parity portion $r_{3p}$ for decoding is queued by the queue 203. At block 235, the decoder 204 computes a vector of error locations from the first parity portion $r_{3p}$, wherein the vector of error locations having the bit location(s) of the error in the data portion $r_{1u}$ of the received codeword $r_1$. At block 236, the correction unit 206 corrects the data portion of the codeword at the computed error location in the data portion, the correcting by means of the generated first parity portion. In one embodiment, the method of FIG. 2B is implemented as machine-readable or computer-executable instructions stored on a machine-readable media (e.g., Dynamic Random Access Memory DRAM) as discussed later with reference to FIG. 6.

Figure 3:
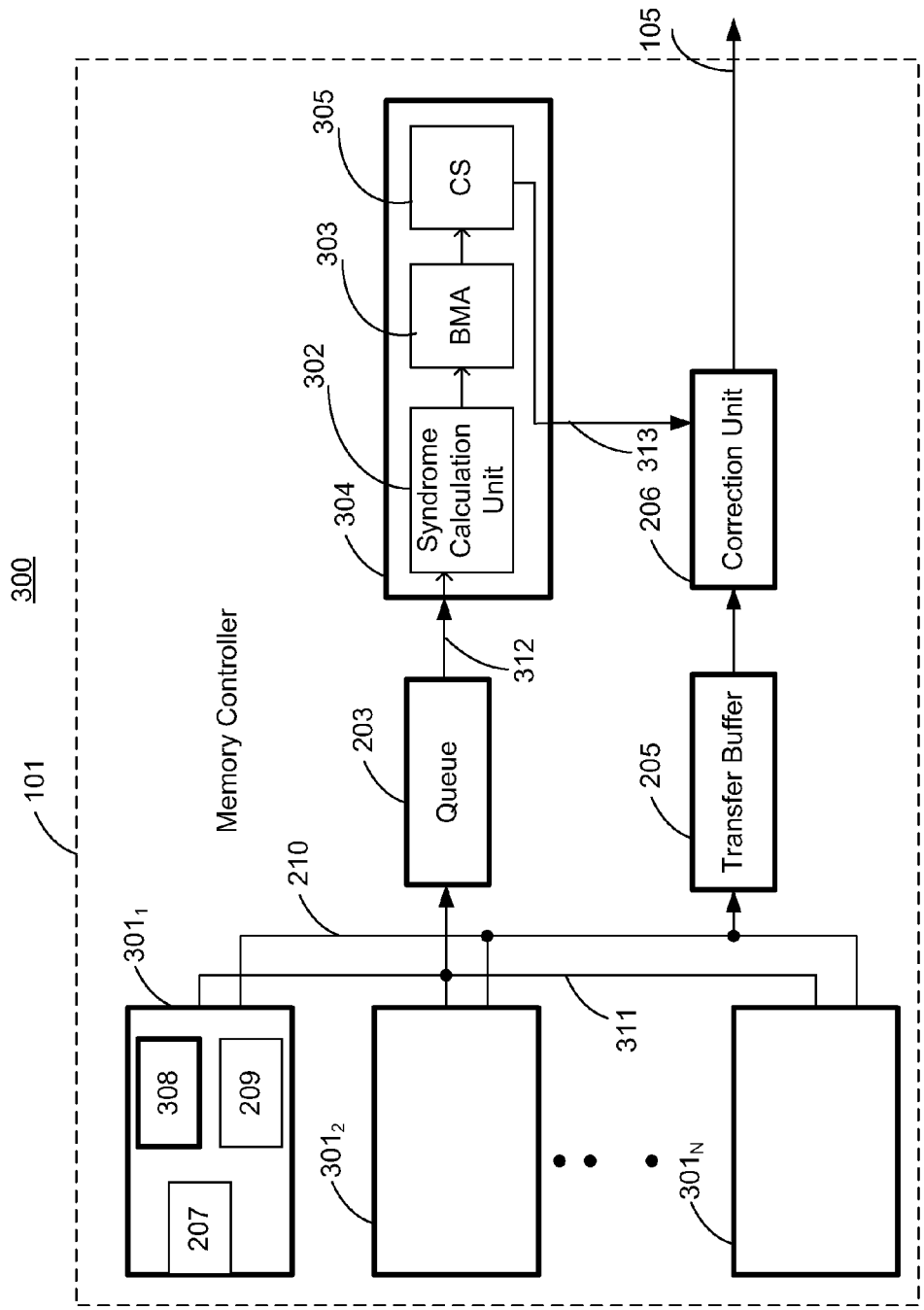
FIG. 3 illustrates block level details of the memory controller implemented with a Bose-Chaudhuri-Hocquenghem (BCH) encoder and decoder, according to one embodiment of the invention.

FIG. 3 illustrates block level details 300 of the memory controller 101 implemented with a Bose-Chaudhuri-Hocquenghem (BCH) encoder and decoder, according to one embodiment of the invention. FIG. 3 is described with reference to FIG. 2A. So as not to obscure the embodiments of the invention, only the major differences between FIG. 2A and FIG. 3 are discussed.

In one embodiment, the memory controller 101 comprises one or more I/O channel interface logic units $301_1$-$301_N$ operable to receive codeword from memory 102. In one embodiment, the encoder 308 is a BCH encoder that is configured to generate the codeword $c_2$ by encoding the received codeword $r_1$ and to generate parity bits $c_{2p}$. In one embodiment, the decoder 204 of FIG. 2A is a modified BCH decoder 304.

A person skilled in the art would realize that a traditional BCH based memory controller requires a syndrome calculation unit for each I/O channel interface logic unit to generate a syndrome which is then queued in a queue prior to decoding the syndrome to generate error locations. In the embodiments discussed herein, since only the XORed parity bits $r_{3p}$ are computed by the second logic unit 209, by XORing the parity bits generated by the encoder 308 and the parity bits corresponding to the received data, and since only those XORed parity bits $r_{3p}$ 311 are stored in the queue 203 the BCH decoder 304 is modified by simplifying a traditional BCH decoder.

In one embodiment, the modified BCH decoder 304 comprises a single syndrome calculation unit 302 which is operable to generate a syndrome from the first parity portion 312.

The term "syndrome" ('s') refers to a product of matrix multiplication of a parity check matrix and a codeword i.e., $s=Hr_1$. In one embodiment, the syndrome is a zero vector when $r_1$ is a codeword without errors. A non-zero syndrome indicates the presence of errors in the codeword and comprises the result of each parity check in the linear block code.

In one embodiment, the modified BCH decoder 304 further comprises a third logic unit 303 coupled to the syndrome calculation unit 302. In one embodiment, the third logic unit 303 is operable to execute a Berlekamp-Massey algorithm (BMA) on the syndrome. In another embodiment, the third logic unit 303 is operable to execute a Peterson-Gorenstein-Zierlerand (PGZ) algorithm on the syndrome. In one embodiment, the modified BCH decoder 304 further comprises a fourth logic unit 305 operable to execute a Chien Search (CS) algorithm on the output of the third logic unit 303. In one embodiment, the output of the fourth logic unit 305 is a vector of error locations 313 which is sent to the correction unit 206 to correct the errors in the data portion of the received codeword.

Figure 4:
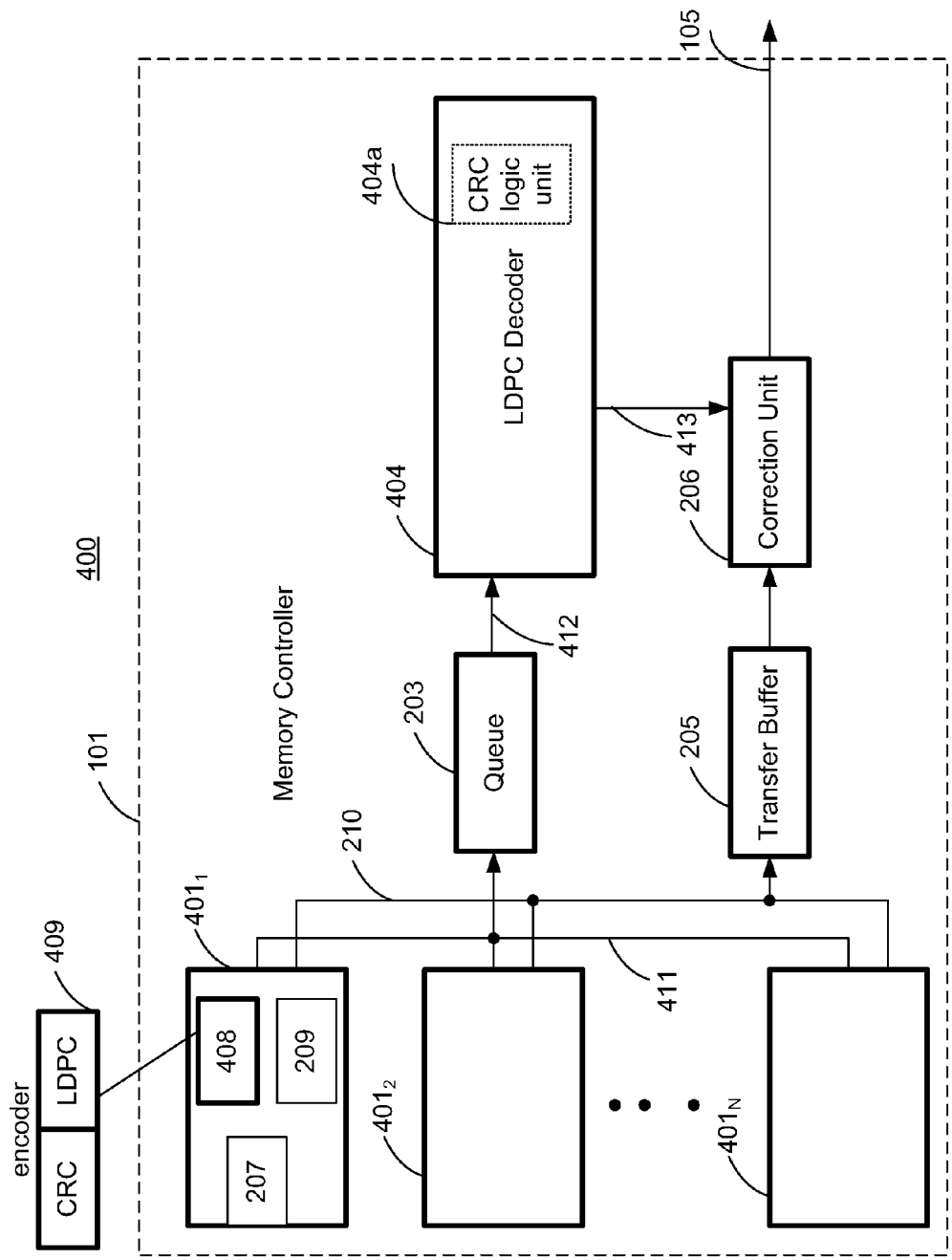
FIG. 4 illustrates block level details of the memory controller implemented with a Low-Density Parity-Check Code (LDPC) encoder and decoder, according to one embodiment of the invention.

FIG. 4 illustrates block level details 400 of the memory controller 101 implemented with a Low-Density Parity-Check Code (LDPC) encoder and decoder, according to one embodiment of the invention. FIG. 4 is described with reference to FIG. 2A. So as not to obscure the embodiments of the invention, only the major differences between FIG. 2A and FIG. 4 are discussed.

In one embodiment, the memory controller 101 comprises one or more I/O channel interface logic units $401_1$-$401_N$ operable to receive codeword from memory 102. In one embodiment, the encoder 208 of FIG. 2A is a LDPC encoder 408 that is configured to generate the codeword $c_2$ by encoding the received codeword $r_1$ and to generate parity bits $c_{2p}$. In one embodiment, the decoder 204 of FIG. 2A is an LDPC decoder 404. In one embodiment, the LDPC decoder 404 is implemented as a Min-Sum Decoder.

In the embodiments discussed herein, since only the XORed parity bits $r_{3p}$ are computed by the second logic unit 209, by XORing the parity bits generated by the encoder 408 and the parity bits corresponding to the received data, and since only those XORed parity bits $r_{3p}$ 411 are stored in the queue 203 the LDPC decoder 404 is simplified because it no longer needs the entire received codeword.

In one embodiment, the LDPC decoder 404 is operable to perform a hard decode based on a hard information read comprising of logical 1 and 0 values for the data portion of the received codeword. In one embodiment, if the hard decode operation fails, then the LDPC decoder 404 is operable to perform soft decode based on soft information read. The term "soft information" refers to a confidence level associated with a logical value of data, the confidence level ranging from 0 (lowest confidence level) to 1 (highest confidence level). A confidence level of 0.6 means that the data value is more likely to be a logical 1 than a logical 0. A confidence level of 0.3 means that the data value is more likely to be a logical 0 than a logical 1.

Figure 5:
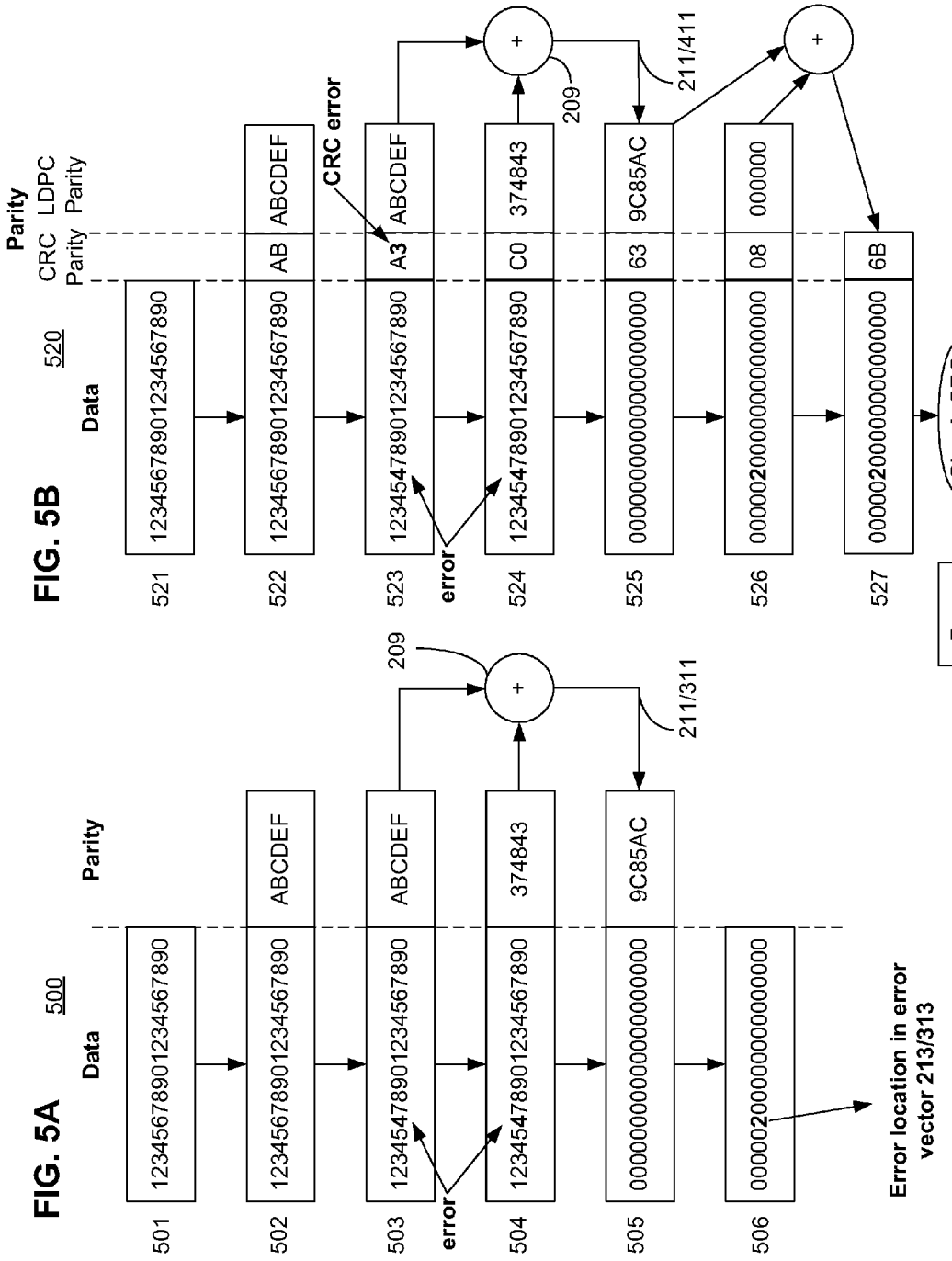
FIG. 5A illustrates a method of encoder assisted decoding of linear block codes by encoding the received data and applying a logical exclusive-OR (XOR) of the parity, according to one embodiment of the invention.
FIG. 5B illustrates a method of encoder assisted decoding of linear block codes by encoding the received data and applying a logical XOR of the parity, according to another embodiment of the invention.

In one embodiment, the encoder 408 comprises a Cyclic Redundancy Check decoder (CRC) encoder and an LDPC encoder together as shown by the encoder 409. In such an embodiment, CRC parity bits form an inner parity code while the LDPC parity bits form an outer parity code of the parity bit code of 411 as shown in FIG. 5B.

The mathematical formulations discussed above are also applicable to the LDPC based encoder assisted decoding of linear block codes.

With reference to FIG. 4, the codeword $c_1$, which is encoded by the encoder 409 before the codeword $c_1$ is written to memory 102, comprises a data portion $c_{1u}$, a CRC parity portion $c_{1crc}$ and LDPC parity portion $c_{1p}$ just as the codeword $c_1$ discussed above with reference to FIG. 2A comprises a data portion $c_{1u}$ and a parity portion $c_{1p}$. The codeword $c_1$ is represented as $c_1 = u G_1 G_2$, where 'u' is data, $G_1$ is the first generation matrix ($G_1 = [I|P1]$) associated with the CRC parity and $G_2$ is the second generation matrix ($G_2 = [I|P2]$) associated with LDPC parity.

The received codeword $r_1$, received by the first logic unit 207 from the memory 102, includes the encoded codeword $c_1$ and an actual error vector 'e' i.e., $r_1 = c_1 + e$. The received codeword $r_1$ can be divided into a data portion $r_{1u}$, CRC parity portion $r_{1crc}$ and LDPC parity portion $r_{1p}$. Similarly, the actual error vector 'e' can be divided into an error vector for the data portion $e_u$, an error vector for the CRC parity $e_{crc}$, and an error vector for the LDPC parity $e_p$.

In one embodiment, the encoder 409 generates codeword $c_2$ from the received codeword $r_1$ i.e., $c_2 = r_{1u} G_1 G_2$. The encoder 409 generates the CRC parity $c_{2crc}$ and LDPC parity $c_{2p}$. In one embodiment, the second logic unit 209 is operable to compute codeword $r_3$ as $r_3 = r_1 + c_2$. As discussed above with reference to FIG. 2A, in such an embodiment, the data portion $r_{3u}$ of $r_3$ is all zeros. In one embodiment, the data portion $r_{3u}$ is compressed to a single bit zero. In another embodiment, the queue 203 only receives the XORed parity data.

In the embodiments discussed herein, the CRC parity forms the inner code while the LDPC parity forms the outer code. In such an embodiment, XORed CRC parity $r_{3crc}$ is computed by the second logic unit 209 by applying a logical XOR operation on the CRC parity $c_{2crc}$ of the encoded received codeword $c_2$ and the CRC parity $r_{1crc}$ of the received codeword $r_1$. In one embodiment, XORed LDPC parity $r_{3p}$ is computed by the second logic unit 209 by applying a logical XOR operation on the LDPC parity $c_{2p}$ of the encoded received codeword and the LDPC parity $r_{1p}$ of the received codeword $r_1$.

In one embodiment, the XORed parity $r_3$ i.e., $r_{3crc}$ and $r_{3p}$, are stored in the queue 203 for decoding by the decoder 404. As mentioned above, since only the XORed parities $r_{3crc}$ and $r_{3p}$ are stored in the queue 203, the queue size is smaller than the queue size of traditional memory controllers which also require received data to be stored in the queue.

In one embodiment, the LDPC decoder 404 is configured to decode an error location vector $e_2$ based on the XORed parity $r_3$ 412 i.e., $r_{3crc}$ and $r_{3p}$. The error location vector $e_2$ (413) are then sent to the correction unit 206 that corrects the received data $r_{1u}$ according to the error in the error location vector $e_2$. In one embodiment, the correction unit 206 applies a logical XOR operation to XORed parity $r_3$ and error location vector $e_2$ to generate a corrected $r_3$. In one embodiment, the corrected $r_3$ is checked for CRC errors by a logic unit 404a before generating a corrected data to be transmitted on 105.

FIG. 5A illustrates a method 500 of encoder assisted decoding of linear block codes by encoding the received data and applying a logical XOR of the parity, according to the embodiments of FIG. 2A and FIG. 3. The data of FIG. 5A is divided into a data portion 'u' and a parity portion 'p'. The example of FIG. 5A is explained with reference to the mathematical formulations discussed with reference to FIG. 2A. The example uses hexadecimal numbers.

So as not to obscure the embodiments of the invention, the reference labels of FIG. 5A are matched with the abbreviations of the mathematical formulations discussed with reference to FIG. 2A. The row 501 refers to data 'u'. The row 502 is the encoded codeword $c_1$ which is encoded by the encoder 208/308 when $c_1$ is written to the memory 102. The codeword $c_1$ includes the parity portion $c_{1p}$ "ABCDEF" and data portion $c_{1u}$ "12345678901234567890." Row 503 is the received codeword $r_1$ with error as shown by the number '4' in the data portion. Row 504 is the encoded received codeword $c_2$. Row 505 is the XORed result $r_3$ obtained by XORing rows 503 and 504 by the second logic unit 209. The '+' sign is equivalent to a logical XOR operation. The output 211/311 of the second logic unit 209 is the XORed parity $r_{3p}$ which is stored in the queue 203. Row 506 is the error vector 213/313 having the error location at the digit location '2' generated by the decoder 204/304. This error vector row 506 is then XORed, by the correction unit 206, with the row 503 to generate corrected data which is transmitted on 105.

FIG. 5B illustrates a method 520 of encoder assisted decoding of linear block codes by encoding the received data and applying a XOR of the parity, according to the embodiments of FIG. 2A and FIG. 4. The data of FIG. 5B is divided into a data portion 'u' and parity portions—CRC parity and LDPC parity. The example of FIG. 5B is explained with reference to the mathematical formulations discussed with reference to FIG. 4. The example uses hexadecimal numbers.

So as not to obscure the embodiments of the invention, the reference labels of FIG. 5B are matched with abbreviations of the mathematical formulations discussed with reference to FIG. 4. The row 521 refers to data 'u'. The row 522 is the encoded codeword $c_1$ which is encoded by the encoder 208/408, where $c_1$ is written to the memory 102. The codeword $c_1$ includes the CRC parity portion $c_{1crc}$ "AB" and the LDPC parity portion $c_{1p}$ "ABCDEF" and the data portion $c_{1u}$ "12345678901234567890." Row 523 is the received codeword $r_1$ with error as shown by the number '4' in the data portion and error '3' in the CRC parity. Row 524 is the encoded received codeword $c_2$. Row 525 is the XORed result $r_3$ obtained by XORing rows 523 and 524 by the second logic unit 209. The '+' sign is equivalent to a logical XOR operation. The output of the 211/411 second logic unit 209 is the XORed parities $r_{3crc}$ and $r_{3p}$ which are stored in the queue 203. Row 526 is the error vector $e_2$ having the error location at the digit location '2' of the data portion. This error vector $e_2$ row 526 is then XORed with row 525 to generate data of row 527 which is the corrected data $r_3$. This corrected data is then checked for CRC. In one embodiment, the CRC is checked by a logic unit 404a inside the decoder 404. In one embodiment, the logic unit 404a applies a logical XOR operation of the row 523 with row 526 to generate data which is transmitted on transmission media 105.

Figure 6:
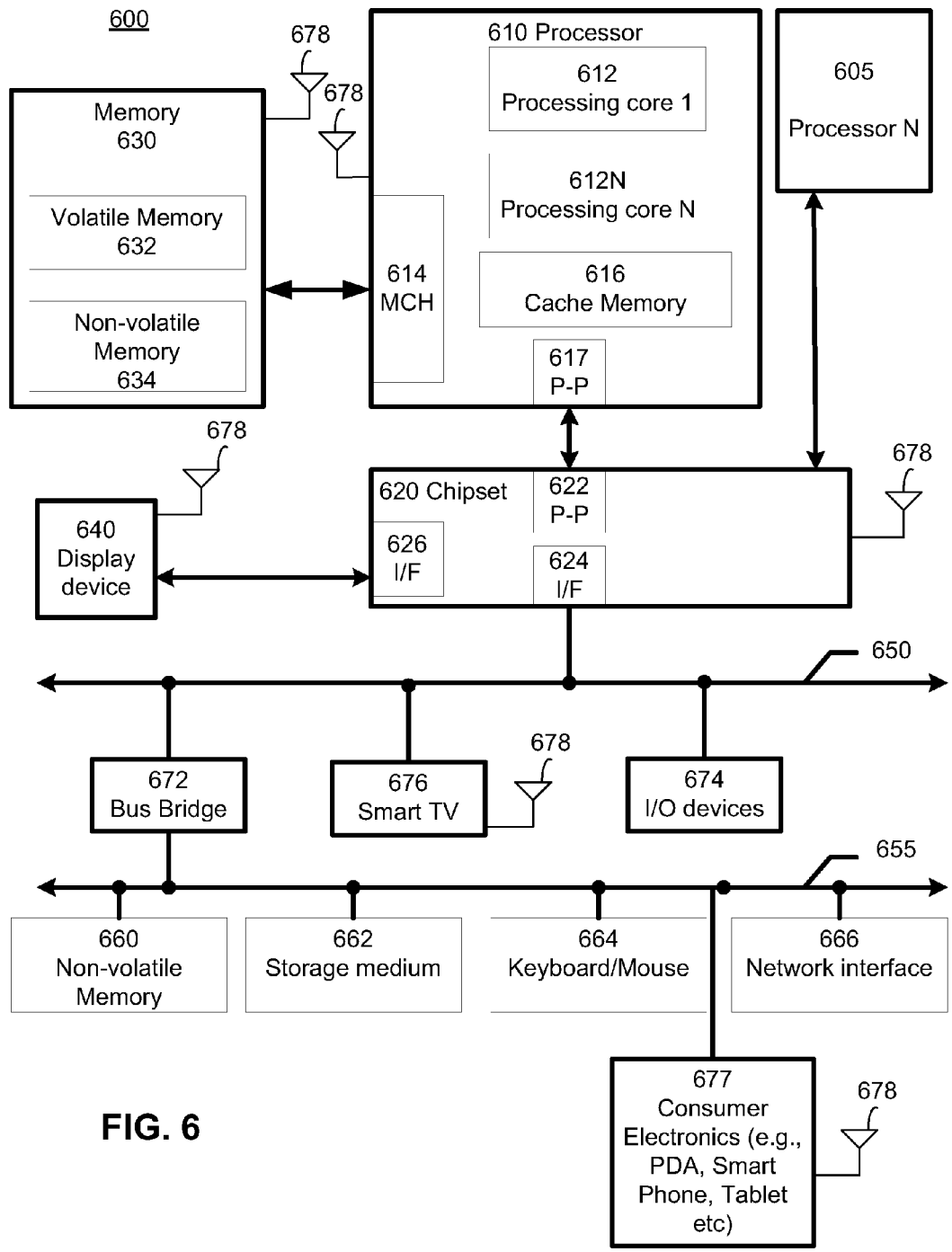
FIG. 6 is a system level diagram with machine-readable storage medium to execute computer readable instructions to perform the methods of various embodiments, the system level diagram also illustrates another embodiment of a memory controller with encoder assisted decoding of linear block codes.

FIG. 6 is a system level diagram with machine-readable storage medium to execute computer readable instructions to perform the methods of various embodiments. The system level diagram also illustrates another embodiment of the memory controller 101 with encoder assisted decoding of linear block codes.

Elements of embodiments are also provided as a machine-readable medium (e.g., 662) for storing the computer-executable instructions (e.g., instructions to implement the flowcharts of FIG. 2B and illustrations of FIGS. 5A-B). The machine-readable medium may include, but is not limited to, flash memory, optical disks, CD-ROMs, DVD ROMs, RAMs, EPROMs, EEPROMs, magnetic or optical cards, or other type of machine-readable media suitable for storing electronic or computer-executable instructions. For example, embodiments of the invention may be downloaded as a computer program (e.g., BIOS) which may be transferred from a remote computer (e.g., a server) to a requesting computer (e.g., a client) by way of data signals via a communication link (e.g., a modem or network connection).

In one embodiment, the system 600 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In another embodiment, the system 600 implements the methods disclosed herein and may be a system on a chip (SOC) system.

In one embodiment, the processor 610 has one or more processing cores 612 and 612N, where 612N represents the Nth processor core inside the processor 610 where N is a positive integer. In one embodiment, the system 600 includes multiple processors including 610 and 605, where processor 605 has logic similar or identical to logic of processor 610. In one embodiment, the processing core 612 includes, but is not limited to, pre-fetch logic to fetch instructions, decode logic to decode the instructions, execution logic to execute instructions and the like. In one embodiment, the processor 610 has a cache memory 616 to cache instructions and/or data of the system 600. In another embodiment of the invention, the cache memory 616 includes level one, level two and level three, cache memory, or any other configuration of the cache memory within the processor 610.

In one embodiment, processor 610 includes a memory control hub (MCH) 614, which is operable to perform functions that enable the processor 610 to access and communicate with a memory 630 that includes a volatile memory 632 and/or a non-volatile memory 634. In one embodiment, the MCH 614 is the same as the memory controller 101 of the embodiments discussed herein.

In one embodiment, the processor 610 is operable to communicate with the memory 630 and a chipset 620. In one embodiment, the processor 610 is also coupled to a wireless antenna 678 to communicate with any device configured to transmit and/or receive wireless signals. In one embodiment, the wireless antenna interface 678 operates in accordance with, but is not limited to, the IEEE 802.11 standard and its related family, HomePlug AV (HPAV), Ultra Wide Band (UWB), Bluetooth, WiMAX, or any form of wireless communication protocol.

In one embodiment, the volatile memory 632 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 634 includes, but is not limited to, flash memory, phase change memory (PCM), read-only memory (ROM), electrically erasable programmable read-only memory (EEPROM), or any other type of non-volatile memory device.

The memory 630 stores information and instructions to be executed by the processor 610. In one embodiment, memory 630 may also store temporary variables or other intermediate information while the processor 610 is executing instructions. In one embodiment, chipset 620 connects with processor 610 via Point-to-Point (PtP or P-P) interfaces 617 and 622. In one embodiment, chipset 620 enables processor 610 to connect to other modules in the system 600. In one embodiment of the invention, interfaces 617 and 622 operate in accordance with a PtP communication protocol such as the Intel® QuickPath Interconnect (QPI) or the like.

In one embodiment, the chipset 620 is operable to communicate with the processor 610, 605, display device 640, and other devices 672, 676, 674, 660, 662, 664, 666, 677, etc. In one embodiment, the chipset 620 is also coupled to a wireless antenna 678 to communicate with any device configured to transmit and/or receive wireless signals.

In one embodiment, chip set 620 connects to a display device 640 via an interface 626. In one embodiment, the display 640 includes, but is not limited to, liquid crystal display (LCD), plasma, cathode ray tube (CRT) display, or any other form of visual display device. In one embodiment of the invention, processor 610 and chipset 620 are merged into a single SOC. In addition, the chipset 620 connects to one or more buses 650 and 655 that interconnect various modules 674, 660, 662, 664, and 666. In one embodiment, buses 650 and 655 may be interconnected together via a bus bridge 672 if there is a mismatch in bus speed or communication protocol. In one embodiment, chipset 620 couples with, but is not limited to, a non-volatile memory 660, a mass storage device(s) 662, a keyboard/mouse 664, and a network interface 666 via interface 624, smart TV 676, consumer electronics 677, etc.

In one embodiment, the mass storage device 662 includes, but is not limited to, a solid state drive, a hard disk drive, a universal serial bus flash memory drive, or any other form of computer data storage medium. In one embodiment, network interface 666 is implemented by any type of well known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, HomePlug AV (HPAV), Ultra Wide Band (UWB), Bluetooth, WiMAX, or any form of wireless communication protocol.

While the modules shown in FIG. 6 are depicted as separate blocks within the system 600, the functions performed by some of these blocks may be integrated within a single semiconductor circuit or may be implemented using two or more separate integrated circuits. For example, although the cache memory 616 is depicted as a separate block within the processor 610, the cache memory 616 can be incorporated into the processor core 612 respectively. In one embodiment, the system 600 may include more than one processor/processing core in another embodiment of the invention.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

While the invention has been described in conjunction with specific embodiments thereof, many alternatives, modifications and variations of such embodiments will be apparent to those of ordinary skill in the art in light of the foregoing description. The embodiments of the invention are intended to embrace all such alternatives, modifications, and variations as to fall within the broad scope of the appended claims.

We claim:

1. An apparatus comprising:
a first logic unit to receive a codeword from a memory, the codeword having a data portion and a corresponding parity portion;
an encoder to encode the data portion of the received codeword and to generate a corresponding parity of the data portion of the received codeword;
a second logic unit to generate a first parity portion from the corresponding parity portion of the codeword received by the first logic unit and the corresponding parity portion generated by the encoder;
a queue, coupled to the second logic unit, to store the first parity portion concatenated with a compressed zero data bit; and
a correction unit to correct the data portion of the codeword via the generated first parity portion.

2. The apparatus of claim 1 further comprises:
a decoder to receive the first parity portion and to determine error locations in the data portion of the received codeword via the first parity portion,
wherein the queue is coupled to the decoder.

3. The apparatus of claim 2, wherein the encoder is configured to encode a linear block code which is systematic, and wherein the second logic unit is configured to generate the first parity portion by applying a logical exclusive-OR operation to the corresponding parity portion of the codeword received by the first logic unit and the corresponding parity portion generated by the encoder.

4. The apparatus of claim 2, wherein the encoder is a BCH encoder and the decoder is a BCH decoder, the BCH decoder comprises:
a single syndrome calculation unit to generate a syndrome from the first parity portion;
a third logic unit operable to execute a Berlekamp-Massey algorithm on the syndrome; and
a fourth logic unit operable to execute a Chien Search algorithm on the output of the third logic unit.

5. The apparatus of claim 2, wherein the encoder is a Low-Density Parity-Check Code (LDPC) encoder and the decoder is a LDPC decoder.

6. The apparatus of claim 2, wherein the correction unit is operable to receive the determined error locations from the decoder and the data portion of the received codeword to generate the corrected data.

7. The apparatus of claim 1, wherein the encoder is configured to encode a linear block code which is systematic, wherein the encoder comprises a Cyclic Redundancy Check (CRC) encoder and a Low-Density Parity-Check Code (LDPC) encoder, and wherein the first parity portion comprises LDPC parity bits and CRC parity bits.

8. A system comprising:
a memory;
a controller coupled to the memory, the controller comprising:
a first logic unit to receive codeword from the memory, the codeword having a data portion and a corresponding parity portion;
an encoder to encode the data portion of the received codeword and to generate a corresponding parity of the data portion of the received codeword;
a second logic unit to generate a first parity portion from the corresponding parity portion of the codeword received by the first logic unit and the corresponding parity portion generated by the encoder;
a queue, coupled to the second logic unit, to store the first parity portion concatenated with a compressed zero data bit; and
a correction unit to correct the data portion of the codeword via the generated first parity portion; and
a processor coupled to the controller to receive the corrected data portion.

9. The system of claim 8, wherein the memory is a NAND flash memory, and wherein the controller is a Solid State Drive (SSD) controller.

10. The system of claim 8 further comprises:
a decoder to receive the first parity portion and to determine error locations in the data portion of the codeword via the first parity portion,
wherein the queue is coupled to the decoder.

11. The system of claim 10, wherein the encoder is configured to encode a linear block code which is systematic, and wherein the second logic unit is configured to generate the first parity portion by applying a logical exclusive-OR operation to the corresponding parity portion of the codeword received by the first logic unit and the corresponding parity portion generated by the encoder.

12. The system of claim 10, wherein the encoder is a BCH encoder and the decoder is a BCH decoder, the BCH decoder comprises:
a single syndrome calculation unit to generate a syndrome from the first parity portion;
a third logic unit operable to execute a Berlekamp-Massey algorithm on the syndrome; and
a fourth logic unit operable to execute a Chien Search algorithm on the output of the third logic unit.

13. The system of claim 10, wherein the encoder is a Low-Density Parity-Check Code (LDPC) encoder and the decoder is a LDPC decoder.

14. The system of claim 10, wherein the correction unit is operable to receive the determined error locations from the decoder and the data portion of the received codeword to generate the corrected data.

15. The system of claim 8, wherein the encoder is configured to encode a linear block code which is systematic, wherein the encoder comprises a Cyclic Redundancy Check (CRC) encoder and a Low-Density Parity-Check Code (LDPC) encoder, and wherein the first parity portion comprises LDPC parity bits and CRC parity bits.

16. A method comprising:
receiving a codeword from a memory, the codeword having a data portion and a corresponding parity portion, wherein the codeword is a systematic codeword;
encoding the data portion of the received codeword to generate a corresponding parity of the data portion of the received codeword;
generating a first parity portion from the corresponding parity portion of the received codeword and the encoded corresponding parity portion;
queuing the first parity portion which is concatenated with a compressed zero data bit; and
correcting the data portion of the codeword via the generated first parity portion.

17. The method of claim 16 further comprises:
computing, by a decoder, an error location from the first parity portion, the error location in the data portion of the codeword.

18. The method of claim 16, wherein generating the first parity portion comprises applying a logical exclusive-OR operation to the corresponding parity portion of the codeword received by the first logic unit and the corresponding parity portion generated by the encoder, and wherein correcting the data portion of the codeword via the generated first parity portion comprises changing bit values at bit locations of the data portion of the received codeword, the bit location corresponding to the determined error locations.

19. A system comprising:
a handheld device; and
a controller communicatively coupled to the handheld device by means of transmission medium, the controller comprising:
  a first logic unit to receive codeword from the handheld device, the codeword having a data portion and a corresponding parity portion;
  an encoder to encode the data portion of the received codeword and to generate a corresponding parity of the data portion of the received codeword;
  a second logic unit to generate a first parity portion from the corresponding parity portion of the codeword received by the first logic unit and the corresponding parity portion generated by the encoder;
  a queue, coupled to the second logic unit, to store the first parity portion concatenated with a compressed zero data bit; and
  a correction unit to correct the data portion of the codeword via the generated first parity portion.

20. The system of claim 19, wherein the handheld device comprises a NAND flash memory, and wherein the controller is a Solid State Drive (SSD) controller.

21. The system of claim 19, wherein the handheld device is a smart phone device or a personal computing tablet device.

22. The system of claim 19 further comprises:
  a decoder to receive the first parity portion and to determine error locations in the data portion of the codeword via the first parity portion,
  wherein the queue is coupled to the decoder.

23. The system of claim 19, wherein the encoder is configured to encode a linear block code which is systematic, and wherein the second logic unit is configured to generate the first parity portion by applying a logical exclusive-OR operation to the corresponding parity portion of the codeword received by the first logic unit and the corresponding parity portion generated by the encoder.

24. The system of claim 19, wherein the encoder is configured to encode a linear block code which is systematic, wherein the encoder comprises a Cyclic Redundancy Check (CRC) encoder and a Low-Density Parity-Check Code (LDPC) encoder, and wherein the first parity portion comprises LDPC parity bits and CRC parity bits.

* * * * *